United States Patent [19]

Frost et al.

[11] Patent Number: 4,926,482
[45] Date of Patent: May 15, 1990

[54] APPARATUS AND METHOD FOR REAL TIME DATA COMPRESSOR

[75] Inventors: Richard L. Frost, Bountiful; Kenneth S. Morley, Sandy; Dennis C. Pulsipher, Farmington, all of Utah

[73] Assignee: Unisys Corp., Blue Bell, Pa.

[21] Appl. No.: 66,587

[22] Filed: Jun. 26, 1987

[51] Int. Cl.$^5$ ............................................. G10L 3/02
[52] U.S. Cl. ................................................ 381/31
[58] Field of Search ................................ 381/29–32, 381/36–41, 47; 364/513.5; 375/122, 25–26, 34

[56] References Cited

U.S. PATENT DOCUMENTS

| | | | |
|---|---|---|---|
| 4,184,049 | 1/1980 | Crochiere et al. | 381/31 |
| 4,386,237 | 5/1983 | Virupaksha et al. | 381/31 |
| 4,516,258 | 5/1985 | Ching et al. | 381/31 |
| 4,583,074 | 4/1986 | Okamoto et al. | 340/347 |
| 4,587,669 | 5/1986 | Gillette | 381/32 |

FOREIGN PATENT DOCUMENTS 0176243  4/1986  European Pat. Off. .

OTHER PUBLICATIONS

Crouse et al., "Adaptive Bit Allocation Technique", IBM Technical Disclosure Bulletin, vol. 27, No. 2, 7/84, pp. 1003–1007.
Huang and Schulthiess–Block Quantization of Correlated Gassian Random Variables–IEE Tran. Comm. Sys., vol. CS11, pp. 286–296, Sep. 1963.
Pulsipher and Frost, Bandwith Compression of Voice and Modem Signals Using Variable-Rate ATC Encoding–Proceedings of the Milcom Conference, vol. 2, Oct. 1986.
K. H. Tzou–A Fast Computational Approach to the Design of Block Quantization–IEEE Trans. on Acoustics, Speech and Signal Processing, vol. ASSP-35, Feb. 8.
Segall, "Bit Allocation and Encoding for Vector Sources", IEEE Trans. Inform. Theory, vol. IT-22, No. 2, 3/76, pp. 162–169.
Cox et al., "Real-Time Simulation of Adaptive Transform Coding", IEEE Trans. on ASSP, vol. ASSP-29, No. 2, 4/81, pp. 147–154.

*Primary Examiner*—Gary V. Harkcom
*Assistant Examiner*—John A. Merecki
*Attorney, Agent, or Firm*—John B. Sowell; Mark T. Starr; Robert S. Bramson

[57] ABSTRACT

High speed computing apparatus for performing real time data compression of analog voice data or digital data to be transmitted over a data link. The incoming data stream is divided into blocks of digital data and the blocks are subdivided into digital samples or elements to be compressed. Each sample is analyzed individually to determine its estimated variance and the marginal return to be gained by alloting the sample one or more of the bits to be employed to define the block of digital data. The bits are assigned samples having the highest estimated variance factor so that an optimum allocation of bits to individual samples is achieved with variable ratio data compression. The allocated bits are employed to encode the samples during real time data compression and transmission.

15 Claims, 9 Drawing Sheets

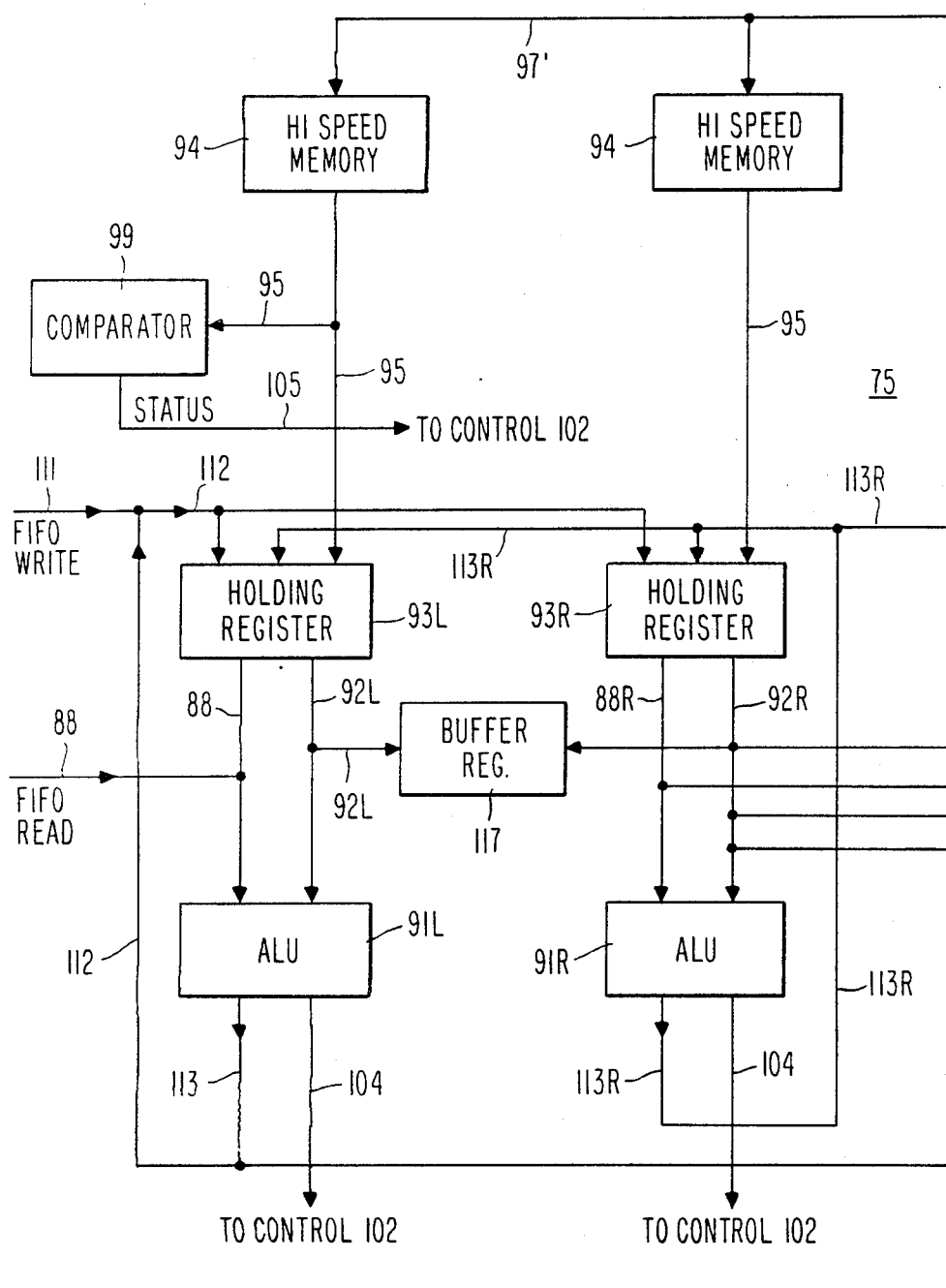

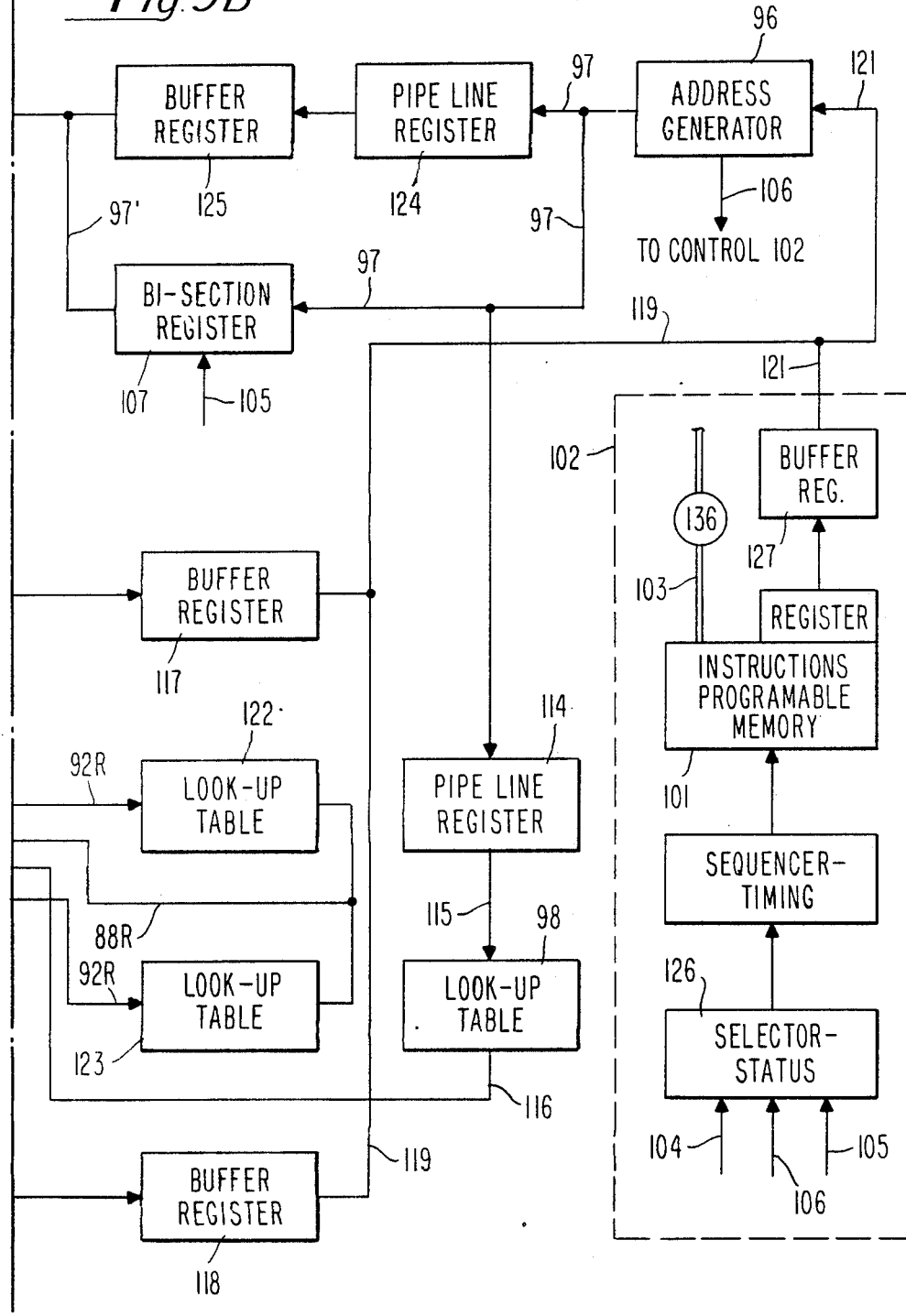

APPARATUS AND METHOD FOR REAL TIME DATA COMPRESSOR

BACKGROUND OF THE INVENTION

1. Field of the Invention

This invention relates to digital apparatus and a method for compressing analog or digital data for transmission by standard commercial data links using adaptive transform coding (ATC) to achieve an optimal allocation of the compressed digital bits to be transmitted. More specifically, the present invention relates to hardware for achieving fast allocation of bits to define blocks of information which permit real time data compression and transmission.

2. Description of the Prior Art

Digital signalling formats are superior to traditional analog formats in many ways. As a result there is a trend to convert analog telephone networks to all digital networks. High grade speech occupies a bandwidth of about 3200 hertz in analog form. A present way of converting this analog speech to digital format is to sample the speech in blocks of 8000 samples per second and assign a digital value to each sample using eight bits per sample. This typical conversion requires a bandwidth which will support transmission of 64 Kbps to reproduce a speech waveform with telephone quality when decoded. This is a most important reason that standard digital data-telephone phone links have been standardized at 64 Kbps data rates.

Standard digital speech phone lines capable of transmitting sixty-four thousand bits per second are commonly used for telephone voice communication. When digital telephone lines are employed, all 64 Kbps capacity is available to the user to use in any manner desirable. It is possible to use such a standard telephone data link line to transmit up to eight voice channels digitally on the same data link line with understandable, though somewhat degraded, voice quality. It is also possible to compress the digital data representations by a ratio of four to one and transmit four voice channels on one digital data speech phone line with very little voice degradation. Heretofore, the delay in achieving such speech compression has mitigated against its use for real time transmission.

Transcontinental digital speech phone lines rent or lease for over $40,000 per month. If the voice information to be transmitted is compressed at a ratio of four to one, the user will achieve saving of over $120,000 per month.

For over twenty-five years scholarly articles have been presented proposing different ways of compressing voice information, however, there is not presently available commercially any apparatus to take advantage of the aforementioned possible savings when transmitting compressed voice information.

Huang and Schulthiess in their paper "Block Quantization of Correlated Gaussian Random Variables", IEEE Tran.-Comm. Sys. vol. CS11, pp. 286–296; September 1963, suggested that blocks of digital information could be encoded on a sample by sample basis and further suggested that digital bit allocation could be employed to define the block of information to achieve data compression. The allocation of bits suggested by this paper is sub-optimal because the optimal distribution of bits b(j) is not a linear function of the variance $\sigma^2(j)$ and requires a noninteger assignment of bits which rarely results in a real distribution of the available bits.

Adrian Segall in his paper "Bit Allocation and Encoding for Vector Sources", IEEE Trans Inform Theory vol. IT-22, pp. 162–169, March 1976, reviewed the different ways of allocating digital bits to achieve data compression of blocks of digital information. Further, this Segall article suggested an algorithm for the optimum allocation of discrete bits to achieve data compression of blocks of digital information. While this paper suggests an optimum allocation of bits, the implementation would require approximately sixty thousand separate computer operations. To perform the same optimum allocation of bits the present invention only requires approximately 7,560 operations which can be performed as simple operations in real time.

Richard V. Cox and Ronald Crochiere of Bell Labs in their paper "Real Time Simulation of Adaptive Transform Coding", IEEE Trans. on Acoustic, Speech and Signal Processing, vol. ASSP 29, No. 2, April 1981 suggested Adaptive Transform Coding (ATC) as an effective means of digitally encoding speech at low bit rates (9.6–16 Kpbs) for transmission on voice lines at 64 Kbps.

Actual telephone conversations were data compressed and transform encoded. The encoded data was transmitted and then transform decoded from the compressed form at the receiving end. This Cox et al article further teaches an ATC encoder and decoder employing a fast processor intended to enable real time data compression transmission.

It would be extremely desirable to provide in a single hardware package a system which would transmit and/or receive two, four or more channels of voice information on a single standard commercial data link channel without noticeable distortion.

SUMMARY OF THE INVENTION

It is a principal object of the present invention to provide a system for compressing digital voice data for transmission on standard commercial data link lines.

It is another principal object of the present invention to provide a high speed Adaptive Transform Coding (ATC) encoder capability of multichannel compression of digital voice data for real time transmission.

It is another principal object of the present invention to provide a high speed system for compressing digital voice data at compression ratios of approximately four to one with optimum allocation of digital bits.

It is yet another object of the present invention to provide a single hardware package that may be connected to a plurality of individual telephones for transmission of voice data over a single data link.

It is a general object of the present invention to provide a system for performing optimum bit allocation used with Adaptive Transform Coding (ATC).

It is another general object to provide apparatus for performing optimum bit allocation used with ATC which achieves high quality reproduction of all classes of signals.

It is a general object of the present invention to provide apparatus for performing ATC at higher speeds than heretofore achievable.

It is a general object of the present invention to provide an economical system for data compression which will promptly pay for itself in practical commercial use.

According to these and other objects of the present invention, there is provided a high speed system for compressing digital voice data which permits the system to receive blocks of digital data in real time and to process the blocks of information and transmit compressed digital replications in real time. Blocks of incoming data are received by a high speed processor and stored as block samples in a high speed memory at designated addresses. The stored digital data samples are processed by performing frequency domain transforms (FDT) on the blocks of sample information and a linear predicted coding (LPC) model of the transformed block of data is created. The (FDT) and the (LPC) model information is stored in the high speed memory and then employed to create a magnitude estimate of the variances of the transformed data sample by sample. The value representations of the estimated variances are then employed to allocate portions of a predetermined number of bits designated to define the blocks of incoming data. Once all of the available bits are allocated to describe the block of transformed data they are encoded and transmitted along with the (LPC) model which allows the transmitted model to decode the bits at the receiver.

BRIEF DESCRIPTION OF THE DRAWING

FIG. 9 (comprising FIGS. 9A and 9B) is a more detailed descriptive block diagram of the preferred embodiment invention of FIG. 8 showing a system capable of performing frequency domain transform (FDT) and for generating a linear predictive coding (LPC) model and for calculating magnitude estimates of the variances from the (LPC) model and for allocating bits based on marginal return calculations.

DESCRIPTION OF THE PREFERRED EMBODIMENT

Before explaining the drawings in detail it should be mentioned that the data lines to be used are clocked at a rate of 64 Kbps by phone companies and the data to be transmitted must conform to this clock rate.

To simplify the explanation of the present invention herein, the blocks of data to be compressed will be explained as being divided into two hundred and fifty-six samples, each of which are defined by twelve bits on the line entering the data compressor. This effectively represents a bit rate of 96 Kpbs which can be output processed to provide an output data rate of 64 Kbps. The present invention system is also capable of input and output data rates at the hardware data compressor at 96 Kpbs even though the output per channel will be 16 Kpbs.

If each of the samples were defined using only six bits instead twelve bits, the six bits when transmitted would effectively cause a two to one compression of the data. Because voice data has an extremely complex spectrum, the bits employed to define each sample cannot be equally allocated to samples and requires an analysis of the voice spectrum. The present invention is concerned with an optimum allocation of the approximate 400 bits which will be used to define the 256 samples of the block of incoming data and will be retransmitted at an effect rate of 16 Kpbs per second to provide a four to one compression ratio based on the data rate of the voice data link line which is 64 Kbps.

Figure 1:
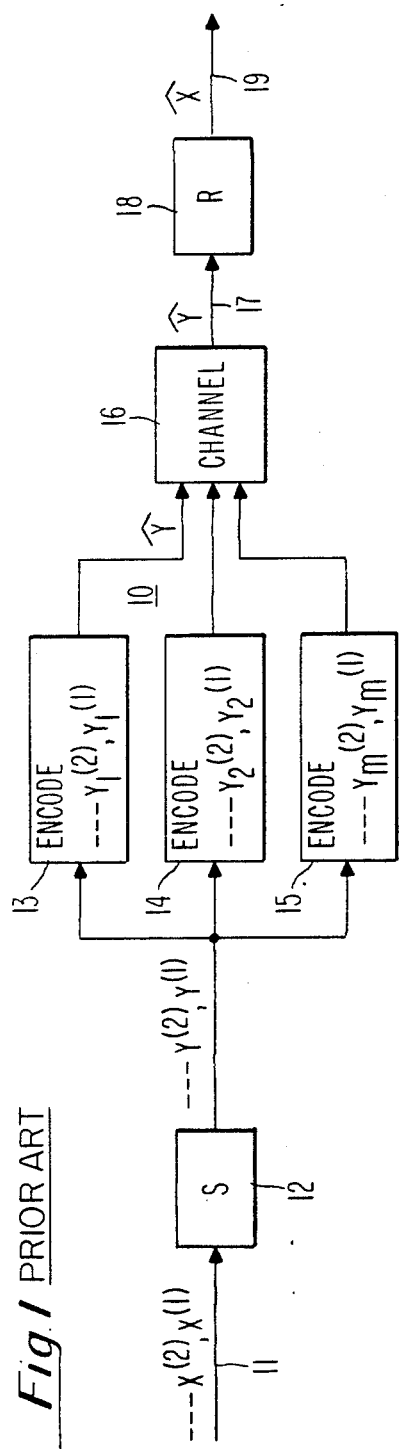
FIG. 1 is a schematic block diagram showing a generic prior art encoding scheme.

Refer now to FIG. 1 showing the basic encoding scheme 10 disclosed in the aforementioned Adrian Segall IEEE Article. The encoding procedure is designed to take advantage of then known coding schemes for sealar sources as applied to vector sources. The author describes the input $X^{(i)}$ on line 11 as the output from a discrete memoryless vector source formed as a sequence of independent identically distributed m dimensional random vectors having a jointly Gaussian distribution. The $X^{(i)}$ vectors are transformed by a nonsingular matrix S (12) into $Y^{(i)}$ vectors yielding uncorrelated components of the Y vectors. The m components of Y vectors are separately encoded at encoders 13, 14, 15 by a source coding technique to provide discrete (individual) digital value $\hat{Y}$ which are transmitted through a discrete noiseless channel 16 to provide the digital values at the decoding utilization device.

The received digital values $\hat{Y}$ on line 17 are inverse transformed by nonsingular matrix R (18) to provide $\hat{X}$ vectors on line 19 that approximate the original signal $X^{(i)}$ on line 11.

Segall recognized that the source information on line 11 to be transmitted through channel 16 would have a limited number of digital bits and that each component or sample of a source word or block was to be processed separately. The problem was to find to optimal allocation of the available bits to the individual components or elements in order to maximize the overall mean-squared error between the source information $X^{(i)}$ and the reproduced sequence $\hat{X}$.

Segall suggest a procedure for obtaining an optimum allocation of available bits. First, a value of marginal return P(b,k) is calculated for each sample. The marginal return values are then arranged in decreasing order. The sample having the highest marginal return is assigned one bit and the decreased marginal return value P(b,k) is again figured for the sample receiving the bit. The samples are then rearranged in decreasing order of marginal return value and the next bit is assigned to the next sample having the highest marginal return. The process is repeated until all of the bits available are assigned. The assigned bits are then employed to encode the samples which are transmitted as a block in digital format and are decoded at the receiver. It can be shown that this procedure will require approximately sixty thousand sorting and merging, etc. operations to allocate four hundred bits over 256 samples using a preferred transform operation.

Figure 2:
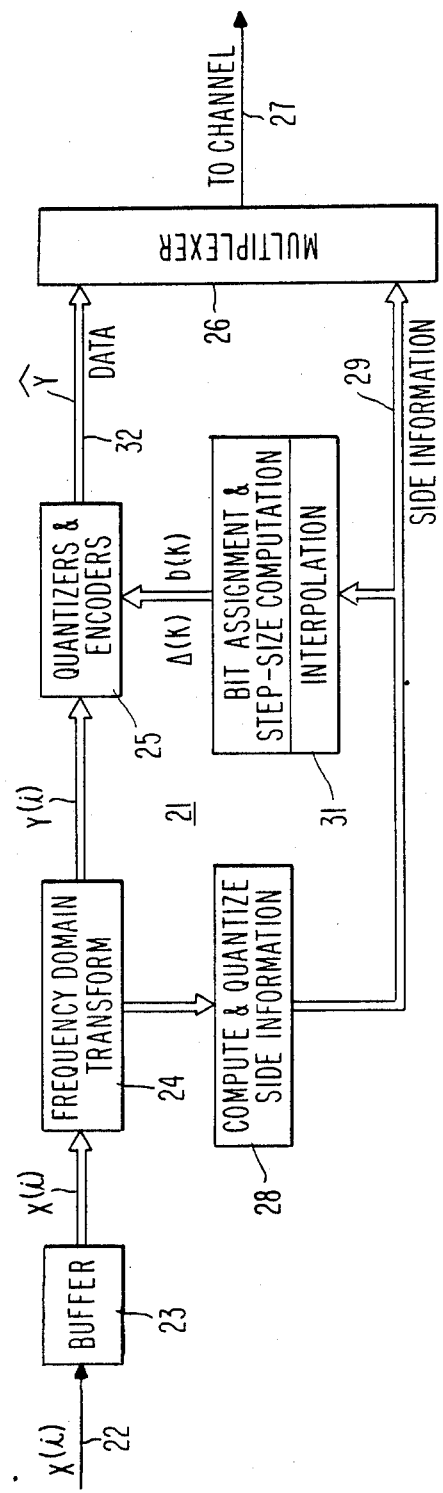
FIG. 2 is a block diagram showing a prior art form of adaptive transform coding (ATC)

Refer now to FIG. 2 showing a block diagram of adaptive transform coding 21 disclosed in the aforementioned prior art Cox and Crochiere IEEE article. The data stream $X^{(i)}$ on line 22 is stored in blocks in buffer 23. The $X^{(i)}$ vectors are frequency domain transformed (FDT) at block 24 being quantized and encoded at block 25 for transmission over noiseless channel 27 after being multiplexed at block 26.

Side information is computed and quantized at block 28. The side information on bus 29 is applied to multiplexer 26 for transmission over channel 27 and is also employed to construct a spectral estimate of the characteristics of the block of information. Bit allocation and assignment to individual quantized samples is made at block 31. The assigned bits for each samples are then encoded at encoder 25 and step size values Δk are applied to the encoded bits before being applied via bus 32 to multiplexer 26.

Figure 3:
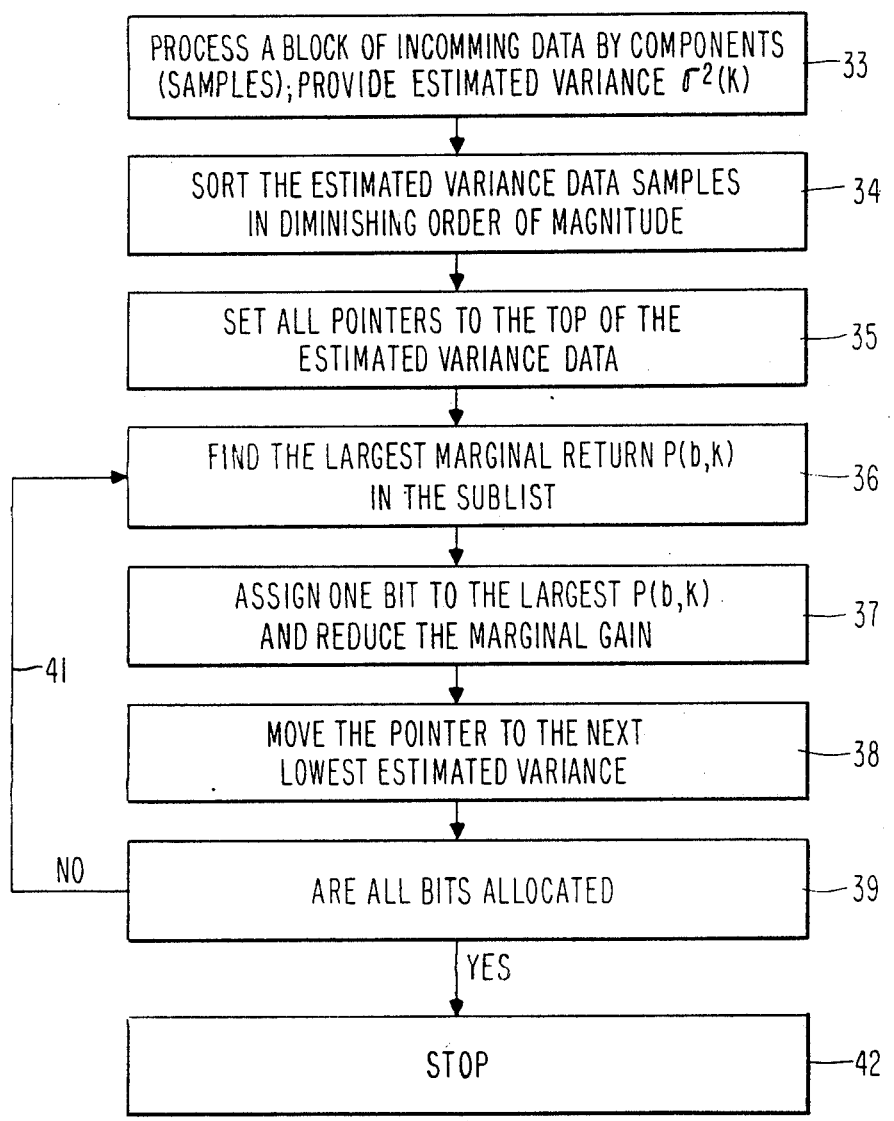
FIG. 3 is a logic flow diagram illustrating the preferred embodiment pointer method of bit allocation employed to achieve optimum high speed data compression.

Refer now to FIG. 3 which is a logic flow diagram illustrating a preferred embodiment pointer method of bit allocation. The incoming data is processed in block 33 to provide estimated variance data $\sigma^2(k)$ necessary to allocate the bits. The estimate variance data is stored for each of the samples and is provided to the system from memory to enable the system to sort in block 34 the estimated variance data in diminishing order of magnitude as will be explained in greater detail hereinafter. The information from the sort is also stored in memory and is available to permit the system to set a predetermined number of pointers to the top of the estimated variance data as indicated by block 35. The system then runs a simple calculation using the estimated variance data to determine the largest marginal return, defined as P(b,k) for each magnitude or value being pointed at by the pointer as shown by block 36. Block 37 shows that one of the 400 bits to be allocated is assigned to the magnitude or value for only the pointers having the highest marginal return. Block 38 is employed to show that the pointer is now moved to the next to the highest (next lowest) magnitude or value of the estimated variance. Block 39 illustrates that the system determines if all of the 400 bits to be allocated have been allocated and if not line 41 shows that the logic returns to block 36 and recalculates the highest or largest marginal return. The system again assigns another bit to the highest marginal return value at block 37 and moves the pointer to the next lowest estimated variance value in block 38. The system again determines whether all of the bits to be allocated have been allocated and returns in the loop via line 41 until such time that all of the bits to be allocated are allocated and the system stops the allocation of bits at block 42. Effectively, the pointer system allocates more bits to the magnitudes or values of the estimated variance that are the largest which effectively maximizes or optimizes the ability of the system to define the block of information to be transmitted.

As an example of the operation of logic flow diagram FIG. 3, the marginal return or marginal error can be theoretically determined for the increase of one or more bits from the equation:

$$P(b,k) = \sigma^2(k)[\phi(b-1) - \phi(b)]$$

where b represents the number of bits assigned and k is the coefficient index applicable.

$\sigma^2(k)$ is the estimated variance for the kth coefficient.

$\phi(b)$ is the mean-squared error obtained when quantizing a Gaussian random variable of variance one using (b) bits.

The term $[\phi(b-1) - \phi(b)]$ is a constant for each bit (b) and is calculated and stored in a memory or look up table for fast access. When the estimated variance is normalized or made unity by dividing the transform coefficient $y^{(i)}$ by the estimated variance $\sigma^2(k)$, the marginal return is calculated by multiplying the estimated variance $\sigma^2$ by the mean squared error term, which has been precomputed for each bit (b). The mean squared error term is called the "cumulative gain" because it is representative of the amounts of gain resulting from raising or improving the marginal return P(b,k) by one additional bit b. An example of the gain from raising the number of bits from zero to one, from one to two and from two to three, etc. is as follows:

| No. of Bits (B) | Cumulative Gain ($B_{K-1} - B_K$) |
|---|---|
| 0 to 1 | 0.6366 |
| 1 to 2 | 0.2446 |
| 2 to 3 | 0.0814 |
| 3 to 4 | 0.02586 |
| 4 to 5 | 0.00805 |
| etc. | — |

The marginal return for the samples in FIG. 3 must be calculated in block 37 in order to assign a new bit to the largest or highest marginal return value. The marginal return for any coefficient k when the number of bits (b) is zero is equal to the variance. Thus, $P(o,k) = \sigma^2(k)$.

If the time domain samples are arranged in a diminishing order of estimated variance $\sigma^2(k)$, the bits may be assigned or allocated without the need for reordering and merging the sorted estimated variance values.

Figure 4:
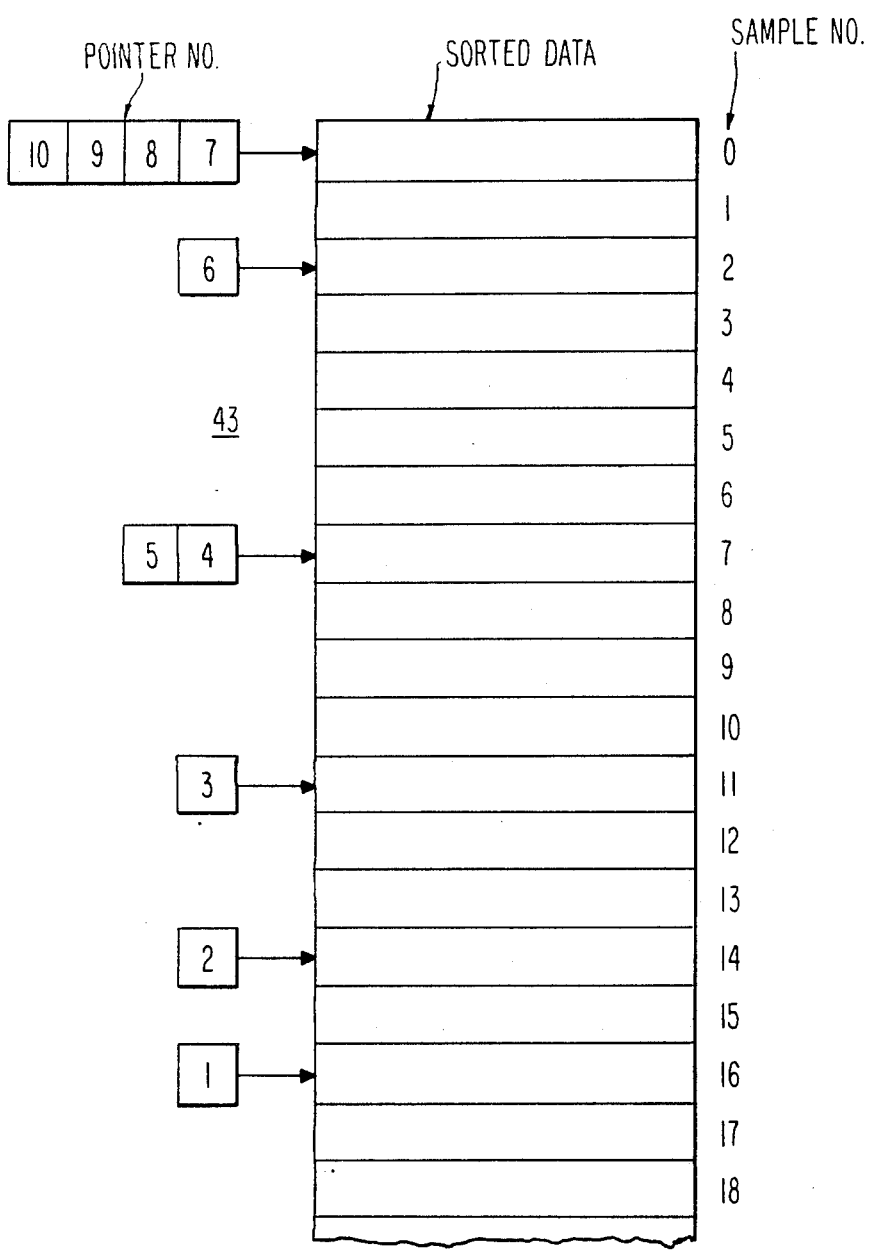
FIG. 4 is a schematic diagram illustrating how the preferred embodiment pointer system is executed to perform high speed bit allocation.

Refer now to FIG. 4 showing a schematic diagram 43 of variance $\sigma^2$ as would occur in memory and at block 34 of FIG. 3. Originally all of the pointers were set to the top of largest estimated variance data as shown in block 35. The ten pointers are numbered 1 to 10 in squares with arrows pointing to the aforementioned samples. The number in the squares also represent the number of bits assigned to the individual sample. The amount of gain derived from assigning any sample one more bit may be expressed by the gain term $G = X(B_{K-1} - B_K)$ where the cumulative gain term is precalculated and stored in memory. All of the pointers start at the top of the ordered sample list, and the samples maintain the initially sorted order throughout the allocation process. Thus, any sample or element which receives its first bit before other elements in the order, also receives its second bit before the same other elements in the order.

FIG. 4 illustrates that the element (sample) at the top of the estimated variance ($\sigma^2$) list have all received no less than six bits because the six bit pointer has moved down to element 2 indicating that all elements above pointer 6 have been assigned 6 bits. When element 0 receives its seventh bit, pointer 7 will move down to element 1, thus, the effect of moving the pointer 7 to element 1 is to assign 7 bits to element 0. The pointers are moved one at a time until all bits are allocated. After all bits are allocated the vectors $Y^{(i)}$ may be quantized and encoded with the bits available for encoding as explained with regards to FIG. 2.

Figure 5:
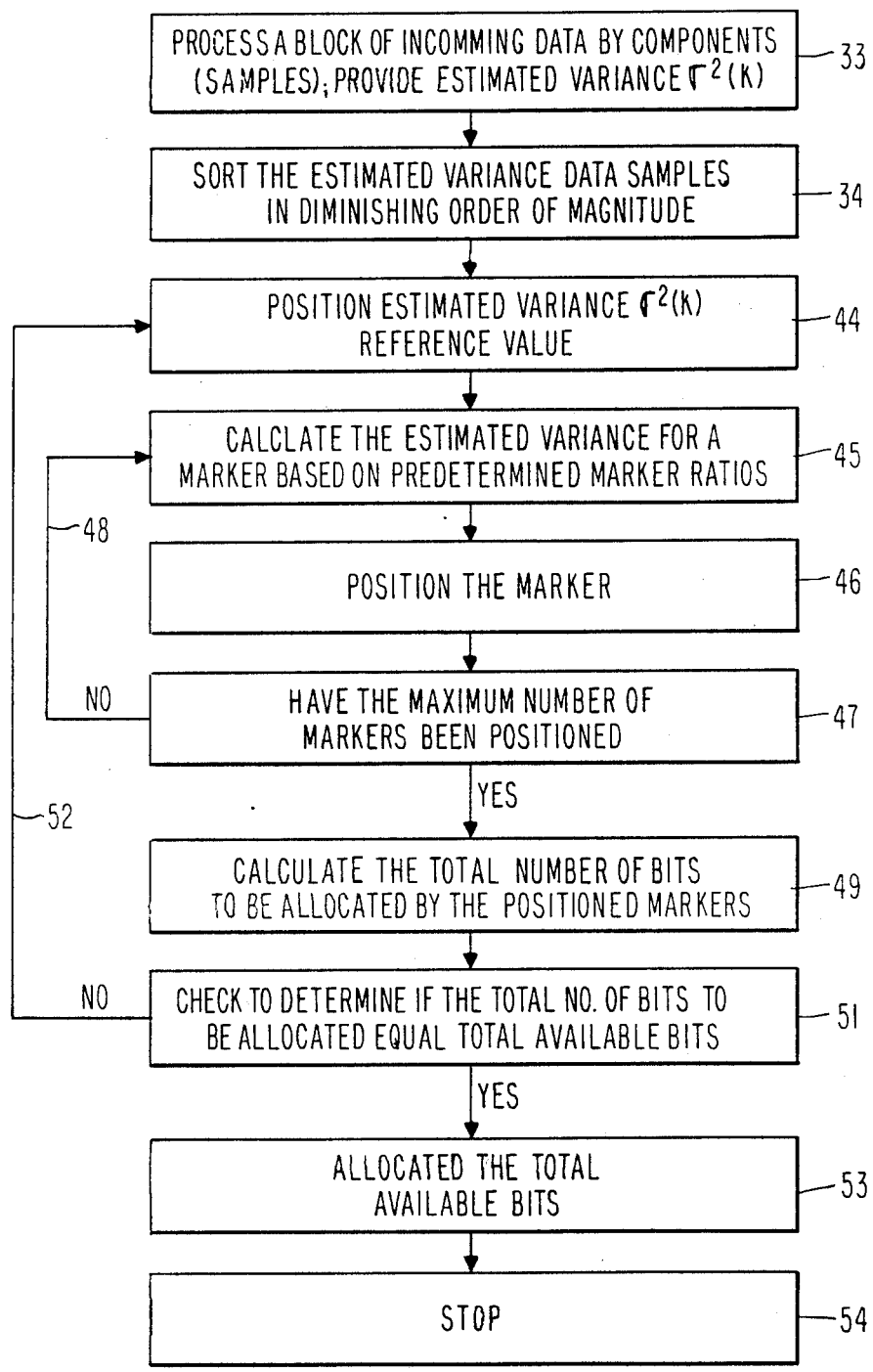
FIG. 5 is a logic diagram illustrating a modification of the preferred embodiment in FIG. 1 using a marker method of allocation to achieve optimum high speed data compression.

Refer now to FIG. 5 showing a logic flow diagram illustrating the preferred embodiment marker method for allocating bits to samples within the blocks. Again the incoming data is processed in block 33 to provide the estimated variance $\sigma^2(k)$ data and sorted in block 34 in a diminish order of value or magnitude of the estimated variance data. The system calculates a reference value in terms of the estimated variance in block 44 for purposes of allocating bits as will be explained in greater detail hereinafter and need not be a marker value.

A second calculation is made in block 45 to provide a value of a new marker associated with several bits to be allocated to a set or group of values of estimated variance which fall in a group or set together. The second calculation is made in block 45. After calculating where to position the marker, as related by marker ratios, the marker is now positioned in block 46 and a determination is made in block 47 whether the maximum number of markers to be positioned have been positioned. If all of the markers have not been positioned, then the answer is NO and the logic enters the loop at line 48 and continues the calculation of new marker values displaced or related by known ratios until all of the markers have been positioned as shown in block 47. When all markers are positioned, the system calculates the markers that are now positioned. After this calculation is made, it is necessary to check in block 51 to determine if the previous calculation allocated all of the bits to be allocated. If the answer is NO, then the system enters the loop on line 52 and returns to calculate a new reference magnitude of value for the estimated variance at block 44, then continues through the loop until it exits to block 53 which results in the completion of the allocation of bits and causes the system to stop at block 54.

Figure 6:
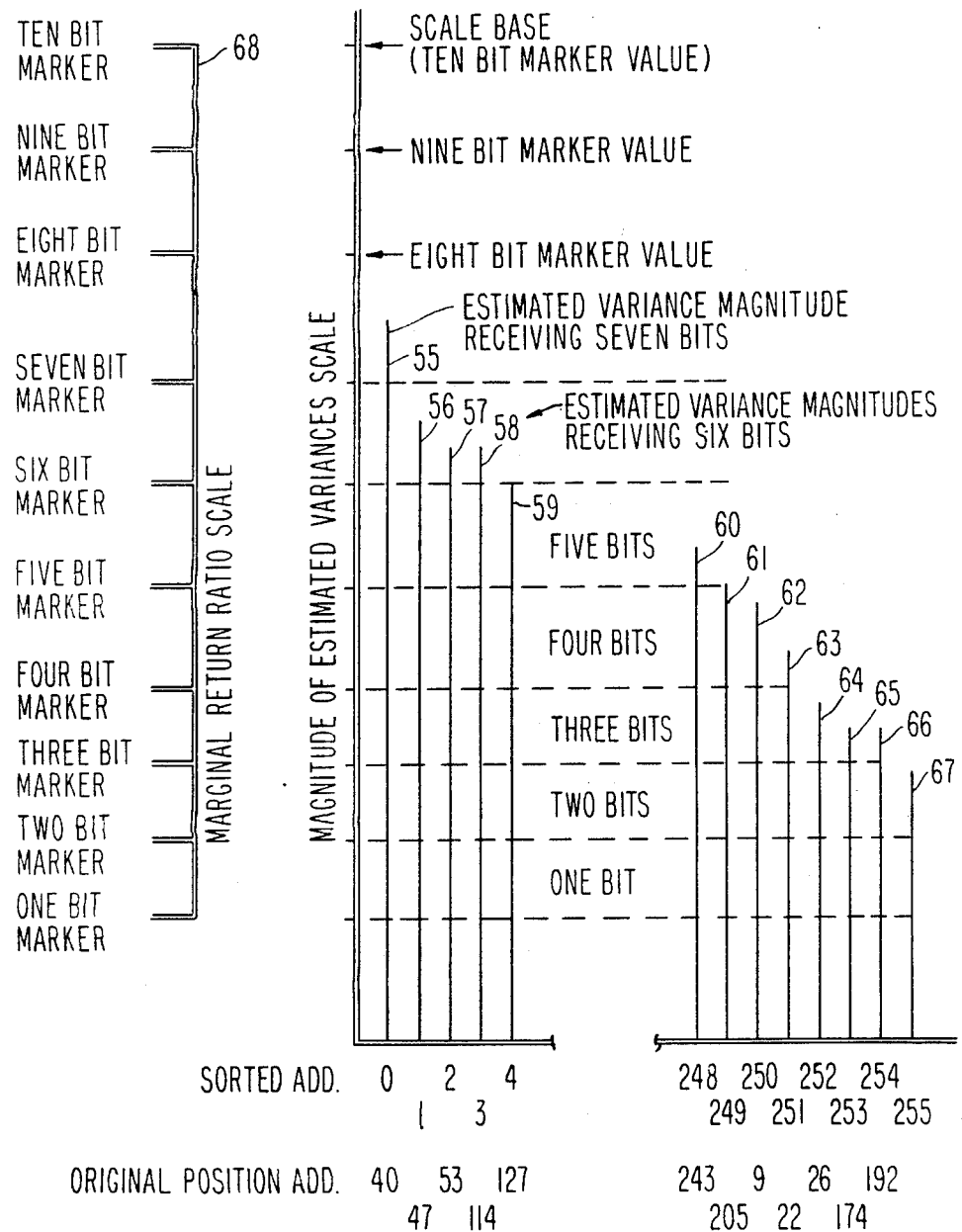
FIG. 6 is a graphic representation of the magnitude of the estimated variance data of a transformed block of data showing how marginal return data is related to the magnitude estimates.

As an example of the operation of the marker method, refer now to FIG. 6 showing in graphic form magnitudes or values of the estimated variance as the ordinate versus samples of the data which constitute a block of data as the abscissa. Bars 55 to 67 are representative of the ordered values of the estimated variance of samples which have been sorted into a diminishing order of magnitude and whose new addresses are numbered from 0 through 255 for purposes of showing that all 256 samples are represented on this chart or graph.

The numbers of the sorted addresses are shown in both new and original position addresses below the bars 55 through 67 to indicate that the original positions of the samples of data have been rearranged and that the original data samples still maintain their associated original sequential addresses in memory. A second axis or ordinate scale is shown superimposed on the gain scale which is representative of the marginal return ratios at Y axis 68. The values shown on the marginal return ratios are in terms of bit markers or pointers employing the same terminology used with regards to the logic or flow diagrams of FIGS. 3 and 5. It will be noted that bar 55 falls between an 8 bit marker and a 7 bit marker and is designated within the range below an 8 bit marker value as an estimated variance magnitude which receives 7 bits. Each of the bars 56, 57 and 58 fall in the range in which the estimate variance magnitude would receive 6 bits. Bars 59 and 61 are shown at the highest point within the range for 5 bits and 4 bits respectively and would receive the lesser value of bits to be assigned. It will be understood that the value of the magnitudes of the estimated variances can vary for different forms of incoming data. The scale for the marginal return ratios 68 has fixed but nonuniformed ratios between the bit markers or bits adjusted to cover all samples. Thus, the marker method effectively adjust the marginal return ratio scale 68 so as to allocate all of the bits to be allocated by adjusting the scale 68 rather than attempting to adjust the magnitude of estimated variance of the individual samples as explained hereinbefore with regard to the distribution of pointers.

It will be acknowledged that prior art algorithms existed for allocating bits to magnitudes similar to the estimated variances employed in the present invention. However, the equations and methods were so complex and lengthy that they could not be performed in real time. One such allocation of bits systems is revealed in the Segall paper referenced hereinbefore. Further, other attempts were made to allocate bits employing suboptimal algorithms or techniques in order to overcome the length of time required to make the bit allocation determination such as the aforementioned Cox et al reference which employed the Haugh and Shortill method, which also produces a suboptimal result.

The present invention provides a simple and efficient method of allocating all of the bits in an optimum manner employing the logic explained hereinbefore regards to FIGS. 3 and 5.

Figure 7:
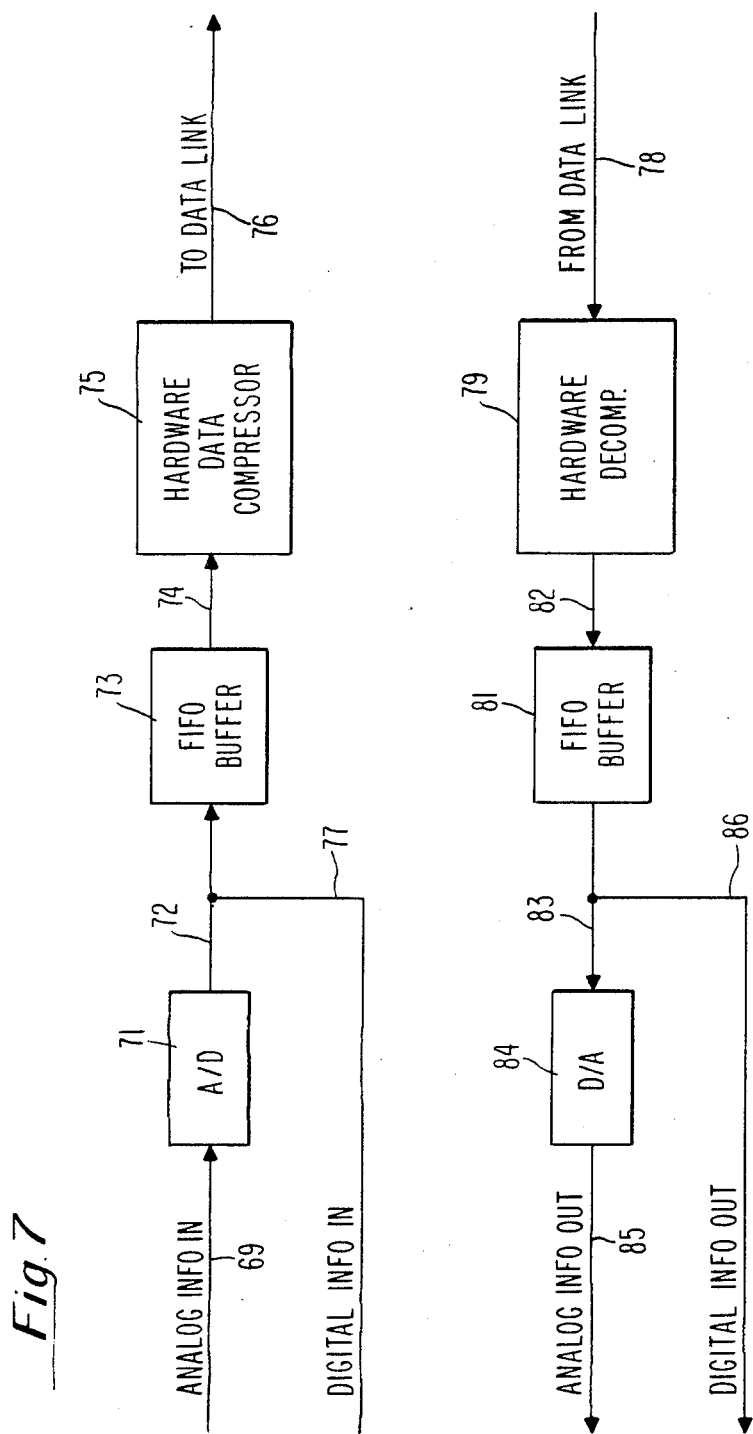
FIG. 7 is a block diagram showing how the high speed compression system may be utilized for digital or analog data.

Refer now to FIG. 7 which is a simplified block diagram showing the environment in which the present invention high speed data compression hardware is utilized. Analog data, including voice data on line 69 is converted to digital data in a/d converter 71 to provide digital data on line 72 at a 96 Kilobits per second (Kpbs). The first in and first out buffer 73 provides a block of data on line 74 to the hardware data compression 75 for processing. The data rate on the line 74 to the hardware data compression 75 is preferably at 96 Kpbs. After the data is processed in the data compressor 75 it is transmitted to a data link on line 76 at 16 Kpbs when a data compression ratio of four to one is desired. It will be understood that the allocation of the number of bits may be increased or decreased so as to change the compression ratio of the analog data to be processed. Since the present system is capable of processing digital information as well as analog information on a digital input information line is shown at line 77 The data sent over the data link is received on line 78 at 16 Kpbs per second and is applied to the hardware decompressor 79. The decompressed output is stored on a first in and first out buffer 81 via line 82. The buffered information in buffer 81 is clocked out on line 83 at 96 Kpbs and is converted from digital to analog form in d/a converter 84 to provide an analog output on line 85 which is a decompressed replica of the original input information on line 69. Since the present data compressor 75 and decompressor 79 are capable of handling either digital or analog data, output line 86 is shown for the output of digital data.

Figure 8:
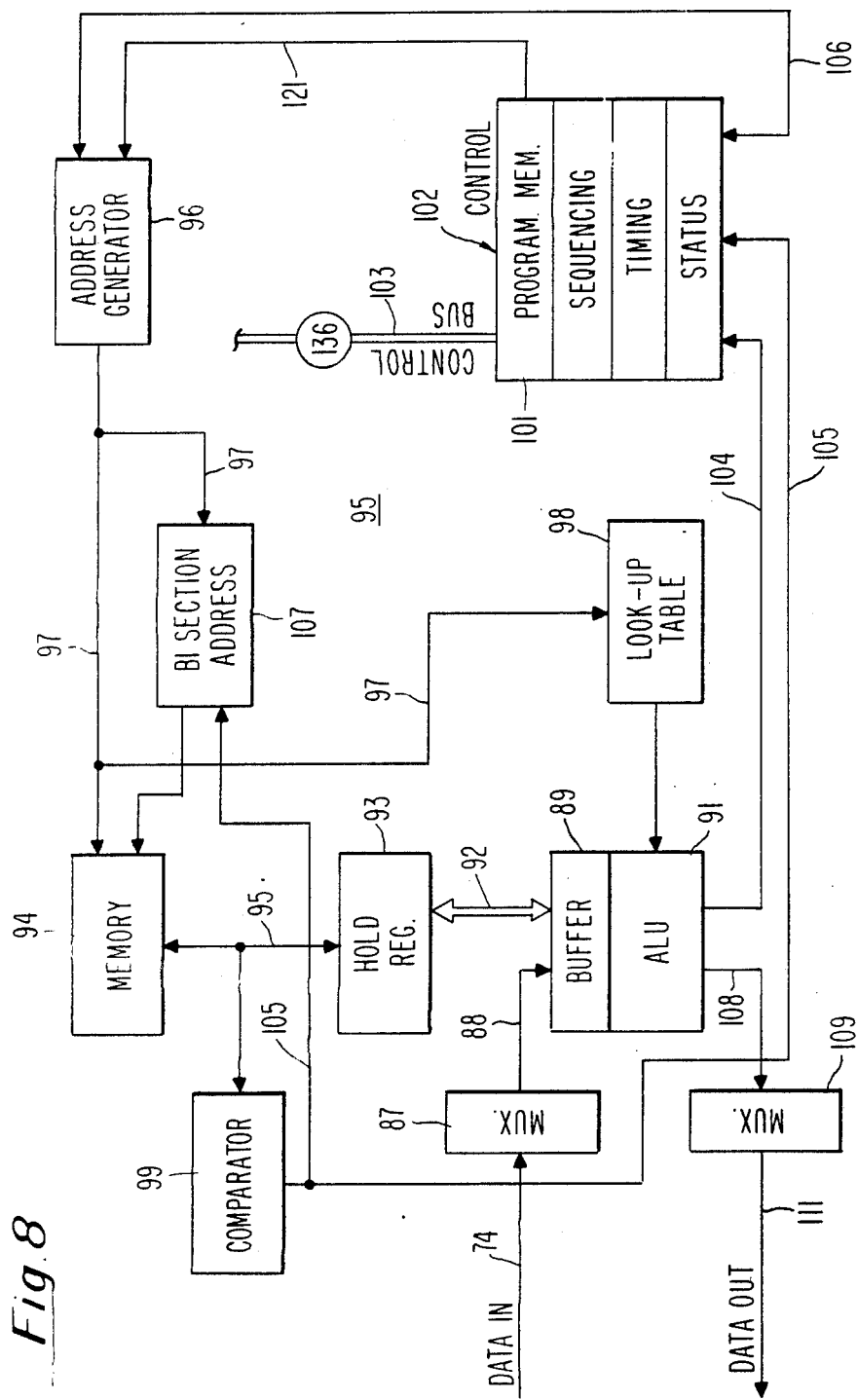
FIG. 8 is a simplified block diagram of the preferred embodiment high speed data compression system employed for illustration purposes only.

Refer now to FIG. 8 which is a simplified block diagram representative of the data compressor 75 of FIG. 7. The digital data on data input line 74 is applied to a multiplexer 87 and applied via line 88 to buffer 89 of ALU 91. Multiplexer 87 illustrates that the present embodiment system is capable of handling four data input lines 74 which could be used for four different phone lines and the information transmitted over one data link line. ALU 91 and buffer 89 are adapted to receive blocks of incoming information which are transferred via bus 92 and holding register 93 to memory 94 via bus 95. The samples to be processed are stored as digital information first in memory 94 before any processing occurs. The address generator 96 accesses the information in memory 94 via bus 97 to retrieve copies of samples of the digital data which is transferred to the holding register 93 and processed in the ALU 91 employing constant value information stored in look-up table 98 to calculate the estimate variance and marginal return data mentioned hereinbefore.

The estimated variance data so calculated is again stored in high speed memory 94 with its associated memory address to enable fast access and to process the information. The processed information is now sorted employing the ALU 91, the holding register 93 and comparator 99. All of aforementioned calculations are programmed in program memory portion 101 of the control block 102. Sequencing and timing are logical functions of the controller 102 which presents controlling and timing information on bus 103 to all of the blocks shown in FIG. 8. The commands on control bus 103 are preferably 136 bit control words which simultaneously control all portions of the data compressor 75. The only information required to be supplied to the controller in order for it to complete its program and sequencing and proper timing is the status of information from the ALU 89 on line 104, the comparator 99 on line 105 and the address generator 96 on line 106. In the preferred embodiment data processor 75 there is provided a bisection address generator 107. This generator is not used in the aforementioned pointer system which was described with regards to FIG. 3, but is employed in the preferred embodiment bit marker allocation system explained with regards to FIG. 5 at block 47.

Data is compressed one block at a time in data compressor 75 and transmitted on output line 108 via multiplexer 109 to data output line 111 similar to data link 76.

Refer now to FIG. 9 showing a more detailed description of the preferred embodiment data compressor 75 shown in FIGS. 7 and 8. The buffered samples are presented on line 88 to ALU 91 where the sample is converted from an integer representation to a floating point representation of the digital sample. The floating point sample on line 113 where it is applied to an input line 112 of the holding register 93L. The floating point representation in digital form is transferred from holding register 93 to the high speed memory 94 via line 95 where it is stored in sequential address order. Once all of the samples are stored in high speed memory 94, they are sorted by comparing the individual samples in comparator 99 as they are transferred via line 95 from the high speed memory 94 to the holding register 93. Based on a decision made at controller 102, the individual samples are transferred back to high speed memory 94 based on their diminishing order of estimated variance as explained hereinbefore.

When the ALU 91 is performing the pointer method operation explained hereinbefore, the address generator 96 is providing addresses on line 97 to access the estimated variance from the memory 94 which is supplied through the holding registers 93 to the ALU 91. Cumulative gain factors which were previously calculated and stored are accessed by address generator 96 via line 97 and pipeline register 114 which supplies an address on line 115 to the look-up table 98. The constants in look-up table 98 are supplied via line 116 to bus 92R which enables bus 92R to supply the right side 91R or the left side 91L of the ALU 91. When the left side of ALU 91 is being supplied, the bus 92R is connected through the ALU buffer 117 to the left side bus 92L which is connected into the ALU 91L. The magnitude of variance multiplied by the cumulative gain G results in the marginal return figure which was explained hereinbefore.

Since there are only 10 values of marginal return to be compared, the highest order of marginal return can be calculated in the ALU, but could be calculated employing the comparator 99 if a large number of comparisons needed to be made. When the largest marginal return is found for a particular pointer, the address associated therewith, and contained in address generator 96, is incremented to the next lowest estimated variance value as explained hereinbefore which is effective to assign one bit to the sample above the pointer. The effect of moving the pointer is to assign one more bit to the elements or the samples having the highest marginal return defined by the pointer addresses. Effectively, the process of system 75 is at block 37 of FIG. 3 and the marginal gain or return is reduced for the sample which received the one bit. The pointer has been moved to the next lowest estimated variance and the process 91 under control of the program memory 101 now makes the decision to determine if all the bits have been allocated and if not, the program again figures the marginal return P(b,k) for the pointers in the sublist. Again, the sample at the pointer which has the largest marginal return receives the assignment of one bit. Its pointer is then moved to the next lower estimated variance and the marginal return associated with that pointer is calculated using the newly pointed to estimated variance. The decision is then made as to whether all bits have been allocated. The marginal return calculation need only be made for the updated pointer corresponding to the sample which receives the last bit, because the other pointers still have the same marginal return. Thus, the calculations proceed until all the bits are allocated and the allocation of bits is completed. When the bit allocation is complete, the data in the high speed memory 94 is quantized by taking the information in high speed memory into the holding register's 93 and performing a quantizing operation in the ALU 91. The quantized information is transmitted sample by sample or element by element and the information to be transmitted is presented on write line 113 from the left side of ALU 91L. Before the information is transmitted on line 111 via line 113, the floating point representations are converted back to integer representations in ALU 91L. While the calculations have been explained as being made on the left side of ALU 91L, it is to be understood that the ALU 91R also performs calculations to process a block of information during real time. The assignment of duties of the two ALUs 91L and 91R are basically a function of the programmed memory 101 and do not require further explanation.

When the quantization calculation was made, the final bit allocation was stored in high speed memory 94. The input data and the bit allocation is transferred on line 95 to the ALU 91. The bit allocation is used as an address to address the constants in look-up table 98. During this operation, the ALU to address generator buffers 117 and 118, are employed to generate the addresses necessary to access the look up table 98 by producing addresses on line 119. Line 119 connects to the bus 121 from control 102 and supplies the addresses to address generator 96.

Whenever a divide operation is performed in ALU 91, a pair of division look-up tables 122 and 123 are provided, which are external to the ALU's 91, for purposes of speeding up the operation. Accordingly, the look-up data from table 122 is used for the exponent and the look-up data from table 123 is used for the mantissa. It will be understood that the look-up tables 122 and 123 are loaded with inverse numbers which avoid lengthy cyclical operations in the ALUs.

In addition to the address generator 96, there is provided in output line 97 a pipeline register 124 and a buffer register 125 which assists in speeding up the address operation of the addresses being supplied to the high speed ROM 94 via line 97.

Refer now to FIGS. 5 and 9 and the bisection address generator 107. As previously explained in block 44 of FIG. 5, a calculation is made of a reference value. The marker values are calculated based on the reference value and the predetermined ratios between markers and the reference value. Those marker values are used to place or position the markers within the sorted data in order to provide a bit allocation. The marker placement is accomplished by loading the marker value into the comparator 99 and comparing that value with values whose addresses are designated by the address generator 96 in conjunction with the bisection address generator 107. When all of the markers have been placed, it is possible to determine if all of the bits have been properly allocated using the predetermined marker ratios and the current reference value.

If the bit allocation is too high, the program in control causes the generation of a new reference value. Conversely, if the bit allocation is too low, a new higher reference value is calculated. The process is repeated until the correct number of bits has been allocated due to the markers' position. By refining the reference value employing successively smaller steps, and repeating the correction loop, the process converges on an optimum placement of marker, and thus, proper allocation of the bits to be used.

In the case the optimum bit allocation is not unique, the optimum allocation is performed for those bits where a unique solution does exist and the remaining bits are allocated arbitrarily among the equally deserving samples.

The control lines 104 from ALU 94, 105 from comparator 99 and 106 from address generator 96 are shown being connected to the selector-status block 126 of the control 102. A control address generator buffer 127 provides an address output on bus 121 to address register 96 from the aforementioned program memory 101. The program control bus 103 is preferably 136 bits wide and is connected to each of the units in FIG. 9 being controlled rather than having the program operated from the ALU 91 as occurs in most minicomputers and small processors.

Having explained a preferred embodiment apparatus for performing real time data compression in the form of a pointer system and a second preferred embodiment in the form of a marker or reference value system, it will be understood that the difference in time required for making the optimum bit allocation does not vary substantially for 400 bits and that the optimum allocation of bits to the samples is the same in both cases. Thus, the method of allocating bits as well as the structure employed results in being able to accept either digital or analog blocks of data and perform the operation of data compression within 30 milliseconds and transmit the compressed data in digital form while performing optimum bit allocation for data compression. The receiving apparatus for decompressing the compressed data is highly simplified in that the data on line 113 or line 76 also includes the information needed to decode the samples being transmitted and the system is less complex than that shown in FIG. 9.

While the preferred embodiment system has been explained employing adaptive transform coding, other forms of transform coding may be employed without having to modify the hardware and method for performing the optimum allocation of bits for data compression which is the crucial factor in obtaining the speeds necessary for real time data compression.

It will be understood that the method explained hereinbefore was directed to performing a four or two to one data compression on voice or speech data. The identical method and apparatus can be employed to perform data compression at other preferred ratios. For example, on systems where the quality of speech is not an important factor and transmission of larger amounts of voice data is important, the compression ratio has successfully been raised to a value of 8 to 1 with no loss of voice data. The higher ratio is accompanied by a degradation of the quality of the voice data being transmitted. Where real time considerations are not important, other forms of lossless data compression are available which perform data compression at ratios up to 10 to 1 with no loss of data. Thus, large masses of repetitive digital data may be transmitted either faster or more economically than the present system and invention. However, the present invention provides the highest reproduction quality of any known system capable of compressing both voice and modem signals for real time transmission over commercially available data links at the bit rates between 9.6 Kbps and 32 Kbps.

We claim:

1. Apparatus for performing real time data compression of blocks of digital or analog data of the type having an input data stream converted to a desired digital format data stream of time domain estimated variance samples comprising:

high speed computing means coupled to said digital data stream for allocating a digital bit to individual estimated variance samples and calculating marginal return values for said samples comparator means, high speed storage means coupled to said high speed computing means and to said comparator means, look-up table means coupled to said computing means for storing predetermined mean-squared error constants employed for computing the highest marginal return for said digital data samples address generation means coupled to said high speed storage means and to said look-up table means, and control means coupled to said computing means, said comparator means and said address generation means for presenting a sequence of commands to provide a real time stream of blocks of compressed data samples from said computing means, said blocks of compressed data each having a predetermined number of bits to be allocated for each block of compressed data, each said block of compressed data having an optimum allocation of bits to the highest marginal return samples, and a minimum bit error rate and the highest average marginal return for each block of compressed data.

2. Apparatus for performing real time data compression as set forth in claim 1 wherein said high speed computing means is programmed by said control means to store said estimated variance for each digital data samples of said input data stream as input data into said high speed storage means.

3. Apparatus for performing real time data compression as set forth in claim 2 wherein said high speed computing means is programmed by said control means to sense and compress a predetermined number of said samples of digital data representative of which define a block of incoming data.

4. Apparatus for performing real time data compression as set forth in claim 3 wherein said
digital data samples are individually examined by said high speed computing means and compressed at variable compression ratios to provide a predetermined data compression ratio for said block of compressed data by allocation of different numbers of bits to different samples.

5. Apparatus for performing real time data compression as set forth in claim 3 wherein said high speed computing means is programmed to calculate estimated variances of said samples of data to be compressed and to arrange said estimated variance samples of a block of data in a diminishing order of magnitudes.

6. Apparatus for performing real time data compression as set forth in claim 5 wherein said high speed computing means is programmed to calculate marginal return values for each of said samples of a block of data and to determine the sample having the highest marginal return by multiplying said estimated variance by a constant stored in said look-up table means.

7. Apparatus for performing real time data compression as set forth in claim 6 wherein said high speed computing means is programmed to assign one bit of said bits to be allocated to the sample having the highest marginal return and to recalculate the marginal return of the sample then having the highest marginal return.

8. Apparatus for performing real time data compression as set forth in claim 7 wherein said high speed computing means is programmed to assign one bit at a time of said bits to be allocated to the sample having the highest marginal return value until all bits to be allocated are assigned to said samples to provide an optimum allocation of bits to the highest marginal return values.

9. Apparatus for performing real time data compression as set forth in claim 8 wherein said high speed computing means is programmed to encode each of said samples employing the number of bits assigned to each sample whereby samples are compressed at different compression ratios in the same block of samples.

10. Apparatus for performing real time data compression as set forth in claim 1 which further includes a plurality of division look up tables containing estimated inverse values coupled to said computing means for performing high speed division by multiplication.

11. Apparatus for performing real time data compression as set forth in claim 1 which further includes a bisection generation means coupled to said address generation means and to said comparator for performing bisection pointer address calculations.

12. A method of performing real time data compression of an input stream of data comprising the steps of:
dividing said input stream of data into blocks of digital data,
dividing said blocks of digital data into samples of digital elements,
calculating an estimated variance for each digital element sample,
arranging said samples of digital data into a diminishing order by magnitude of said estimated variances,
examining each sample to determine the sample having the highest marginal return,
reducing the marginal return of the sample having the highest marginal return by allocating one bit of a predetermined number of bits to be allocated to define said block of digital data,
moving a pointer representative of the number of bits allocated to the particular sample which had the highest marginal return to the next lowest sample in the order of samples,
repeating the steps of determining the sample having the highest marginal return and reducing the marginal return of the sample having the highest marginal returns by allocating one bit and moving a pointer representative of the number of bits allocated to the particular sample until all bits to be allocated are allocated, and
encoding each said sample with the number of bits so allocated to each individual sample in real time.

13. A method of performing real time data compression as set forth in claim 12 which further includes the steps of:
predetermining in advance the total number of bits to be allocated to define a block of digital data of greater bits thus defining the compression ratio of data compression.

14. A method of performing real time data compression as set forth in claim 13 which further includes the step of determining side information defining the spectral energy content characteristics of said block of digital data and wherein the step of encoding each sample further includes encoding each sample employing said side information.

15. A method of performing real time data compression of an input stream of data comprising the steps of:
dividing said input stream of data into blocks of digital data,
dividing said blocks of digital data into samples of digital elements,
examining each sample of digital data to determine the energy content of each sample,
sorting said samples in a diminishing order of energy content,
determining the cumulative gain related to the energy content applicable to defining any one sample with one or more bits in order to digitally define said sample,
determining the maximum number of bits to be employed to define any one sample,
positioning a reference marker and other markers which have a fixed ratio relative thereto to the sorted samples,
assigning bits to samples between markers in said sorted order to provide an optimum allocation of bits,
checking to determine if the total number of bits allotted to define a block of digital data have been allocated, and
encoding each said sample of elements of said block of digital data employing an optimum allocation of digital bits.

* * * * *